United States Patent [19]

Furlan et al.

[11] Patent Number: 5,640,159
[45] Date of Patent: Jun. 17, 1997

[54] QUANTIZATION METHOD FOR IMAGE DATA COMPRESSION EMPLOYING CONTEXT MODELING ALGORITHM

[75] Inventors: Gilbert Furlan, Roquebrune-Cap-Martin, France; Jorma Johannes Rissanen, Los Gatos, Calif.

[73] Assignee: International Business Machines Corporation, Armonk, N.Y.

[21] Appl. No.: 643,201

[22] Filed: May 6, 1996

Related U.S. Application Data

[63] Continuation of Ser. No. 176,635, Jan. 3, 1994, abandoned.

[51] Int. Cl.[6] .............................. H03M 5/00; H03M 7/00
[52] U.S. Cl. .............................. 341/51; 341/107
[58] Field of Search ........................ 341/107, 51

[56] References Cited

U.S. PATENT DOCUMENTS

| | | | |
|---|---|---|---|
| 4,652,856 | 3/1987 | Mohiuddin et al. | 340/347 |
| 5,067,152 | 11/1991 | Kisor et al. | 380/10 |
| 5,121,191 | 6/1992 | Cassereau et al. | 358/13 |
| 5,122,873 | 6/1992 | Golin | 358/133 |
| 5,124,791 | 6/1992 | Israelsen et al. | 358/136 |
| 5,134,478 | 7/1992 | Golin | 358/136 |
| 5,136,374 | 8/1992 | Jayant et al. | 358/133 |
| 5,136,663 | 8/1992 | Nishio | 382/56 |
| 5,323,187 | 6/1994 | Park | 348/405 |
| 5,363,099 | 11/1994 | Allen | 341/107 |
| 5,379,355 | 1/1995 | Allen | 382/56 |
| 5,450,132 | 9/1995 | Harris et al. | 348/148 |

OTHER PUBLICATIONS

J. Rissanen, Complexity of Strings in the Class of Markov Sources, IEEE Transactions on Information Theory, vol. IT–32, No. 4, pp. 526–532, Jul. 1986.

J. Rissanen & G. G. Langdon, Universal Modeling and Coding, IEEE Transactions on Information Theory, vol. IT–27, No. 1, pp. 12–23, Jan. 1981.

J. Rissanen, Universal Coding, Information, Prediction, and Estimation, IEEE Transactions on Information Theory, vol. IT–30, No. 4, pp. 629–636, Jul. 1984.

J. Rissanen, A Universal Data Compression System, IEEE Transactions on Information Theory, vol. IT–29, No. 5, Sep. 1983.

J. M. F. Moura & N. Balram, Recursive Structure Noncausal Gauss–Markov Random Fields, IEEE Transactions on information Theory, vol. 38, No. 2 pp. 334–354, Mar. 1992.

Y. Linde, A. Buzo, R. M. Gray, An Algorithm for Vector Quantizer Design, IEEE Transactions on Communications, vol. Com–28, No. 1, pp. 84–95, Jan. 1980.

J. Ziv, On Universal Quantization, IEEE Transactions on Information Theory, vol. IT–31, No. 3, pp. 344–347, 1985.

Quantizing for Maximum Output Entropy (Abstract), IEEE Transactions on Information Theory, p. 612, Sep. 1971.

P. H. Ang, P. A. Ruetz & D. Auld, Video Compression Makes Big Gains, IEEE Spectrum, pp. 16–19, Oct. 1991.

C. E. Shannon, A Mathematical Theory of Communication, The Bell Sys. Tech. Journal, vol. XXVII, No. 3, pp. 379–423, Jul. 1948.

*Primary Examiner*—Jeffrey A. Gaffin
*Assistant Examiner*—Peguy JeanPierre
*Attorney, Agent, or Firm*—James C. Pintner

[57] ABSTRACT

A method, system, and manufacture are provided, for use in connection with data processing and compression, for quantizing a string of data values, such as image data pixel values. The quantization is achieved by grouping the data values, based on their values, into a predetermined number of categories, each category containing the same total number of values. For each category, a value, preferably a mean value of those in the category, is selected as a quantization value. All of the data values in the category are then represented by the selected quantization value. For data strings having a dependency (that is, the values of one or more of the data values provide information about values of other of the data values), the dependency is modeled by a method in which a modeling algorithm defines contexts in terms of a tree structure, and the basic method of grouping into categories and selecting a quantization value for each category is performed on a per node (i.e., per context) basis.

18 Claims, 3 Drawing Sheets

(basic quantizer for independent data)

QUANTIZATION METHOD FOR IMAGE DATA COMPRESSION EMPLOYING CONTEXT MODELING ALGORITHM

This is a continuation of application Ser. No. 08/176,635 filed on Jan. 3, 1994, now abandoned.

FIELD OF THE INVENTION

This invention relates generally to the field of image processing. In particular, this invention relates to a system and process for quantizing image signals for image data compression.

DESCRIPTION OF THE PRIOR ART

Data compression refers to the process of transforming a stream of analog or digital data to a smaller or "compressed" form from which the original, or some approximation of it, can be recovered at a later time. Reversible or "lossless" data compression is achieved when data in a compressed form can be subsequently decompressed to the original form. "Lossy" data compression allows the decompressed data to vary from the original on condition that the decompressed data preserves the essence of the original by satisfying some fidelity criterion.

Although the cost of storage has declined rapidly, and continues to do so, it is still highly desirable to use data compression techniques in many applications. A prime example of the need for advanced data compression schemes arises with image data, where the vast amount of data imbedded in color, gray-scale, or even hi-level (black and white) imagery may easily overwhelm hardware capacity for storage, retrieval, communication or display if the data is not adequately compressed. For example, a color image of 1024× 1024 picture elements (pixels) at 24 bits per pixel will occupy 3.1 megabytes of storage in an uncompressed form, far exceeding the capacity of a high-density floppy diskette.

Furthermore, while it is true that bandwidth limitation does not cause a problem in some applications, the growing amount of information that users wish to communicate, often in real time, necessitates some advanced form of compression for efficient, secure and reliable use of the communication channels. For example, the audio bandwidth is usually around 20 kHz, which translates into a digital data rate of about 1.4 megabits per second (Mb/s) for high-quality stereo sound. On the other hand, sampled video source signals require much higher bit rates ranging from 10 Mb/s for broadcast-quality video to more than 100 Mb/s For high-definition television (HDTV) signals. Thus, without data compression, it will take almost an hour to transmit the aforesaid color image over a 9600-baud line. Another example in which compression is required results from the fact that if speech is digitized using a simple PCM (pulse code modulation) system consisting of a sampler followed by "scalar quantization," the resulting signal will no longer have a small enough bandwidth to fit on ordinarily telephone channels. It is therefore not an overstatement that the success of communication/video technology depends on efficient and effective data compression schemes.

The first slop in data communication is often the digitization of a sequence of analog data, such as the light intensity reflecting from a graphical document. Such digitized data allows the best use of modern integrated-circuit technology for data processing, storage and transmission. For example, nonlinear processing of signals can be performed easily in the digital domain, and signals of several types representing different sources can be multiplexed easily.

The next step, closely connected to the digital sampling step, is to "quantize" the data by converting relatively high-rate, high resolution data into lower-rate, lower resolution data without an excessive loss of fidelity or increase of distortion. For instance, quantization might include truncation of lower significance bits of the digitized data, so that data values which differed only in the values of the lower significance bits are quantized to the same value.

In this respect, quantization is tantamount to a lossy compression. For example, the quantization of an image calls for constructing a suitable approximation of the image such that it looks lo the eye as good as the original while requiring less storage space. Examples include PCM, transform coding, predictive coding, hybrid coding, as well as adaptive versions of these techniques, in which the quantization of continuous quantities into discrete quantities is done on scalars, e.g., on individual real-valued samples or waveforms or pixels of images. It is noted that the steps of digitization and quantization are often intertwined; for example, bilevel quantization of an analog signal can be performed prior the digital coding.

A general framework for dealing with quantization is provided by Shannon's elegant theory of rate distortion; Shannon, "A Mathematical Theory of Communication," Bell Systems Technical Journal, Vol. 27, pp. 379–423, 623–656 (1948). In this framework, the original and the quantized signals are modeled as samples from random processes. A signal may be, For example, the gray level of any one of a two-dimensional array of pixels. The subjective quality deterioration is expressed as the mean distortion between the two signals. The distortion is measured by some distance function, e.g., a quadratic difference, between a signal and its quantized counterpart. The objective of quantization is to construct the quantized image in such a fashion that the mutual information between the two signals is minimized subject to the constraint that the mean quadratic difference does not exceed a threshold value, selected a priori to control the quality of the quantized image.

A small mutual information translates into a weak dependency. A dependency is defined as a relationship between data values, such that knowing one or more of the signal provides information about other signals of the image or other signal string. For example, in an image, there may be recurring patterns or regions of solid color. Thus, knowing the values of a representative sample of the pixel values representing the patterns or color provide information about occurrences of the patterns or color elsewhere in the image.

A weak dependency means that little such information about other signals is provided by the known signals. Therefore, an optimally quantized image in accordance with Shannon's rate-distortion theory may be regarded as one which deviates as much as possible towards the smooth direction within the pre-selected constraint on the quadratic distance. Because it is easy to encode a sequence of "smooth" signals, the mean code length of optimally quantized signals is expected to approach a minimum.

According to Shannon's rate-distortion theory, optimal compression to any desired approximation for a given mean distortion is achievable only by coding large blocks (or "vectors") instead of scalars, such as blocks of contiguous image data pixels. This is especially true when the data compression system has a memory, i.e., the coding of a signal is permitted to depend on past signals. Thus, compared to scalar quantization, in which a single analog sample is mapped to a finite set of signals, a conventional vector quantization (VQ) scheme, in its simplest form, is a mapping of a block of digitized signals of an analog sample into a vector that is selected from a fixed and finite set of vectors. Hence VO can he viewed as a direct generalization of quantization of scalars to vectors.

A vector typically consists of an ordered set of amplitude (e.g., gray-level) values, each specified by an 8-bit number in the case of monochrome imagery containing up to 256 amplitude levels. In a direct application of VQ to image compression, the quantizer mapping is decomposed into two operations: an encoder operation and n decoder operation. At the encoding step, contiguous source samples (e.g., pixels) are grouped into signal blocks, or signal vectors, so that each signal vector describes a small segment of the original image. A signal vector is then compared to and approximated by one of a finite set of prototype patterns or templates, which will be referred to as "code-vectors." The code-vectors making up the set were previously (i) formed during the vector formation process and (it) stored in a codebook.

Finding a code-vector to approximate the signal vector generally means finding a code-vector made up of values which are similar, or close in value, to corresponding values of the signal vector. It is possible, then, to measure a distortion between the code-vector and the signal vector. A distortion is a measure of the differences between signal vector values and corresponding code-vector values. For a given set of code-vectors, the signal vector is approximated by a code-vector from the set which has minimum distortion with respect to the signal vector, or, alternatively, a minimum distortion not to exceed some distortion threshold. Thus, a number of input signal vectors, for each of which a given code-vector is the closest match, are all quantized as that code-vector.

One way of representing the code-vectors is to index them according to their probabilities of occurrence, using shorter code words for the more likely block configurations and longer code words for less likely block configurations. Upon transmission, the indices of the code-vectors are mapped into output vectors taken from the same codebook in the decoding operation. These closest-matching code-vectors are then concatenated, or "stitched", together in the same order as the corresponding input vectors to form a contiguous body of data, or "patchwork quilt," representing a reconstructed image.

In a memoryless VQ, such coding operations efficiently exploit the spatial correlation between pixels in an individual vector, but ignores entirely any spatial correlation across the boundaries of contiguous vectors.

A drawback of such a VQ scheme is that it is very difficult to construct a vector quantizer which would reach optimal compression to any desired approximation, given a pre-selected distortion measure, because vectors with indefinitely growing numbers of components must be involved. The alphabet extension, or set of code-vectors, inherent in the VQ techniques, must grow exponentially in dimensionality for the improvement of the output image.

Another disadvantage with such typical VQ is that a large effort is required to create and to search the whole codebook in order to identify the nearest matching code-vector to an input vector. The larger the dimensionality of the alphabet extension, the better the signal dependencies are captured, but the larger the required codebook becomes. Many of the state-of-the-art VQ techniques use fairly low dimensional vectors while employing a variety of additional schemes to capture the dependencies between the vectors. For example, instead of searching sequentially one large codebook, a tree-searched vector-quantization (TSVQ) encoder uses a sequence of small codebooks arranged in a tree form to facilitate the search effort. However, a TSVQ encoders conceivably requires a greater storage space for the multitude of small codebooks.

A further disadvantage with typical VQs, either memoryless ones or those with a memory, is that a distortion measure (hereinafter, DM) must be defined to quantify the performance of the system. Ideally, a DM should be tractable to permit analysis, computable so that it can be evaluated in real time, and subjectively meaningful so that small and large quantitative distortion can be correlated respectively with good and bad subjective quality. Typical DMs include the quadratic difference (or "quadratic error distortion") and the weighted mean square error (WMSE) distortion. The drawback is that it is both difficult and controversial to define a "universal" measure of distortion which is applicable for a vast variety of input data.

Additionally, the codebook design depends to a great extent on the DM chosen. For example, in the LBG method, Linde et al., "An Algorithm for Vector Quantizer Design," IEEE Trans. Communications, Vol. COM-28, No 1, pp. 84–95, Jan. 1980, a locally optimal, "average" codebook is computed for a given DM from a large training set of image vectors which are statistically typical of those which will arise in the images to be encoded. The training vectors are taken from a cross section of "representative" images. The justification of using an average codebook, to be shared by a number of similar vectors, is that such a set of similar vectors can be modeled as a stationary source, for which a single codebook is sufficient. It is difficult, of course, to make a general statement of what the set of similar vectors actually comprises. The result of using an average codebook and a pre-determined DM is that such a DM may provide a poor measure of the difference between two data sets, or that compression suffers from poor match between input vectors and the code-vectors, because the codebook is only locally optimized with respect to the designated DM and the stationary source. More sophisticated VQ methods have been designed where either initial codebooks are iteratively improved or several different DMs arc used. However, such methods often demand significantly more storage or higher arithmetic complexity.

Finally, it is recently shown that the performance advantage of VQ over scalar quantization may be quite small for the quadratic DM and probabilistic source. See Ziv, "On Universal Quantization," IEEE Trans. Inform. Theory, Vol. IT-31, No. 3, pp. 344–347, May 1985. However, no practical universal quantization scheme is proposed by this reference.

Another relevant phenomenon which complicates the task of image processing and compression is the fact that the human eye perceives distortion in a way apparently defying any mathematical description. In this respect, the aforementioned quadratic distortion men, sure guarantees the fidelity of a processed image in a very approximate sense. Thus, a quantization scheme preferably should not rely on a distortion measure which inaccurately measures the human eye's subjective perception of distortion. However, since VQ requires the use of some sort of distortion measure, the distortion perceived in a quantized image is undesirably great because of the inaccuracy of the distortion measure.

On the other hand, there are features of human-eye perception that may be employed advantageously. For example, the eye is less sensitive to distortions in a high spatial frequency than to those in a low spatial frequency. Thus, the image may be separated into a number of frequency bands by various pre-processing techniques such as discrete cosine transform (DCT), wavelets, and subband filters (the latter discussed below). The high-frequency signals are then coded with fewer bits than the low-frequency signals.

One of the techniques exploiting this feature is the Joint Photographic Experts Group (JPEG) technique, developed under the auspices of the International Standards Organization (ISO). In the JPEG technique, each vector, e.g., an 8×8 block of pixels, is transformed by DCT into an 8×8 block of coefficients of the varying spatial frequencies. The coefficients are then quantized pursuant to the principle of increasing coarseness with the increasing frequency. Finally, the quantized coefficients are encoded by taking into account their frequency of occurrence as well as some simple linear dependency between each coefficient and its counterpart in the next block.

The last JPEG step (encoding) takes some advantage of the statistical dependencies in the image to shorten the code length. Nonetheless, since each coefficient is a function of the 64 pixels in the block, a particular quantization of the original block hardly ever corresponds to the lightest packing of the 64-dimensional vector space with respect to any pre-selected distortion measure. A more efficient way to account for the statistical dependencies is to model the image as a Gauss-Markov field, which permits linear estimation of each pixel from the surrounding pixels. See J. M. F. Moura and N. Baltram, "Recursive Structure of Noncausal Gauss-Markov Random Fields," IEEE Trans. Inform. Theory, Vol. IT-38, No. 2, pp. 334–354, March 1992. The estimation error is quantized with a uniform scalar quantization, and the quantized result is finally encoded.

Another related technique, the so-called subband technique, uses a small number of filters to split the original image into components, each of which has an energy concentrated in the spatial frequency determined by its filter. See, for instance, Jayant et al., "Geometric vector quantization," U.S. Pat. No. 5,136,374, issued Aug. 4, 1992. Lower spatial frequency subbands are coded using a high resolution code. Higher spatial frequencues are processed by a VQ scheme. Fidelity thus favors the low-frequency components. The "sampled up" results, i.e., components interpolated to the original resolution, are added to form the final quantized product.

Thus, while it is desirable to employ a distortion measure related to human eye perception, conventional schemes have not been able to simulate human-eye perception without causing disadvantageously great distortion.

In summary, the central issue in the prior art is the design of a suitable quantizer, pursuant to Shannon's rate-distortion theory, for the quantization of vectors or blocks of pixels with respect to either a pre-selected distortion measure, such as the quadratic distance function, or an undefined measure induced by the fact that the human eye is relatively insensitive to high-frequency distortions. Auxiliary issues include the unraveling of the dependencies between the blocks and the encoding of the quantized signals.

SUMMARY OF THE INVENTION

It is therefore an object of the present invention to provide a universal quantizer for data compression which produces a combination of high data compression and low distortion which is difficult to obtain with conventional techniques.

It is another object of the invention to provide a universal quantizer for data compression which avoids the need for a large codebook of code-vectors and does not consume large amounts of time and processing prover searching through such a codebook for a match with an input vector.

It is a further object of the present invention to provide a universal quantizer for data compression of a data sequence, the quantizer including means for performing two main tasks of quantizing and constructing a model of dependencies in the data sequence, the means for quantizing and constructing operating with virtual separation.

Briefly, according to one aspect of the present invention, a method is constructed for the quantization of any sequence of signals, such as a rasterized sequence of image data pixel values, expressed in terms of real numbers generated by a probabilistic source for data compression. The present method allows each individual input signal set (such as pixels of an image) to be quantized separately without considering whether it belongs to a family of "similar" signal sets. The present invention needs no alphabet extension or codebooks for quantization, nor does it require an arbitrarily pre-selected distortion measure (DM). Rather, the distortion is measured by the difference between the stochastic complexity of the original signal and that for the quantized signal, relative to a broad class of source models, of which all Markov models are included as a special case.

According to another aspect of the present invention, a system of universal quantization for image signals is constructed, in which each individual pixel is quantized in a manner dependent upon the context of that pixel. No vectors of pixels are formed, nor an arbitrary distortion measure is involved.

In accordance with the invention, there is provided a universal quantizer for data compression in which quantization is tailored to each input signal set without requiring shared codebooks, thereby saving storage space.

While the invention is primarily disclosed as a method, it will be understood by a person of ordinary skill in the art that an apparatus, such as a conventional data processor, including a CPU, memory, I/O, program storage, a connecting bus, and other appropriate components, could be programmed or otherwise designed to facilitate the practice of the method of the invention. Such a processor would include appropriate program means for executing the method of the invention. Also, an article of manufacture, such as a pre-recorded disk or other similar computer program product, for use with a data processing system, could include a storage medium and program means recorded thereon for directing the data processing system to facilitate the practice of the method of the invention. It will be understood that such apparatus and articles of manufacture also fall within the spirit and scope of the invention.

These and other objects and advantages of the present invention will no doubt become obvious to those of ordinary skill in the art after having read the following detailed description of the preferred embodiment which is illustrated in the various accompanying drawings.

DESCRIPTION OF THE PREFERRED EMBODIMENT

The present invention is based upon a formulation of the rate distortion problem in a fundamentally different way from conventional quantization schemes, such as a vector quantizer. While the present invention may be embodied in many forms, it is understood that the present disclosure is not intended to limit the invention to the embodiments illustrated.

Figure 1:
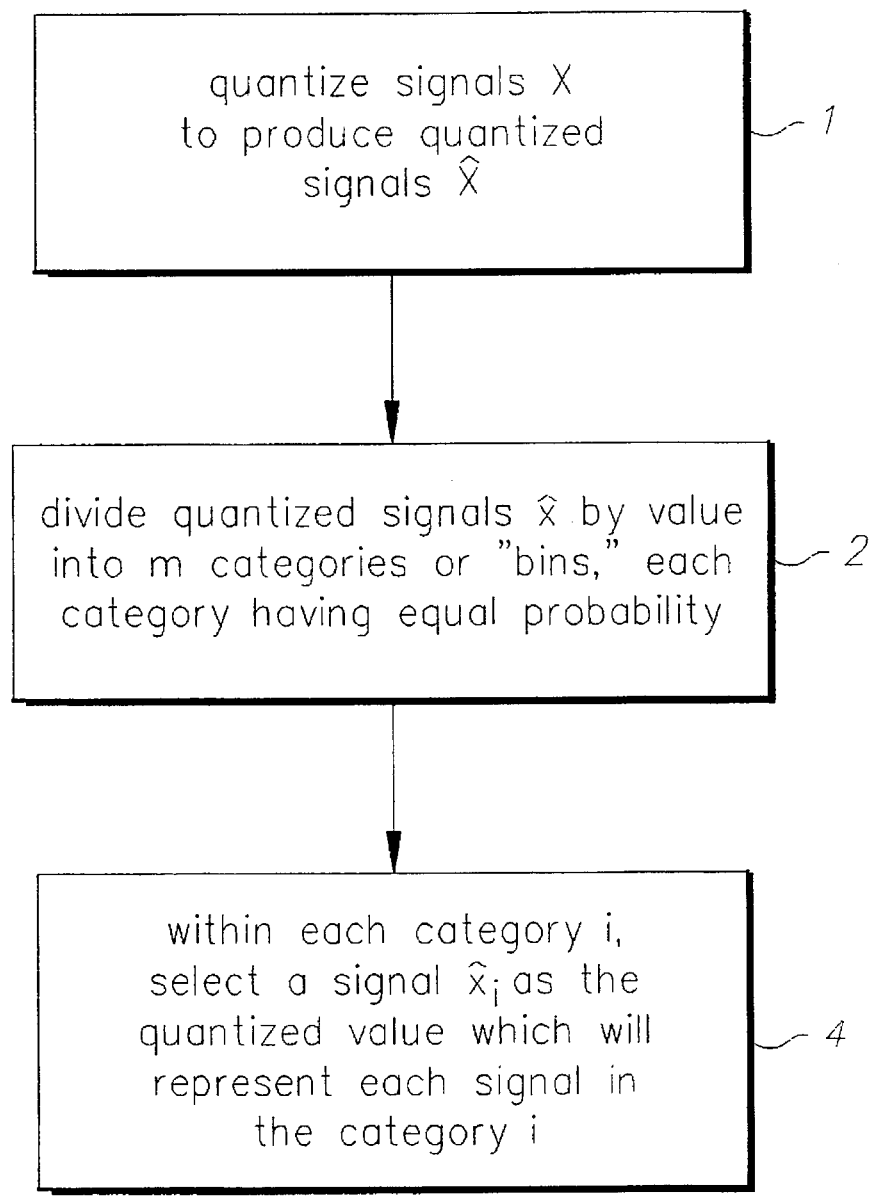
FIG. 1 is a flowchart showing a first embodiment of the method of the invention for pixel data strings having no dependencies.
Figure 3:
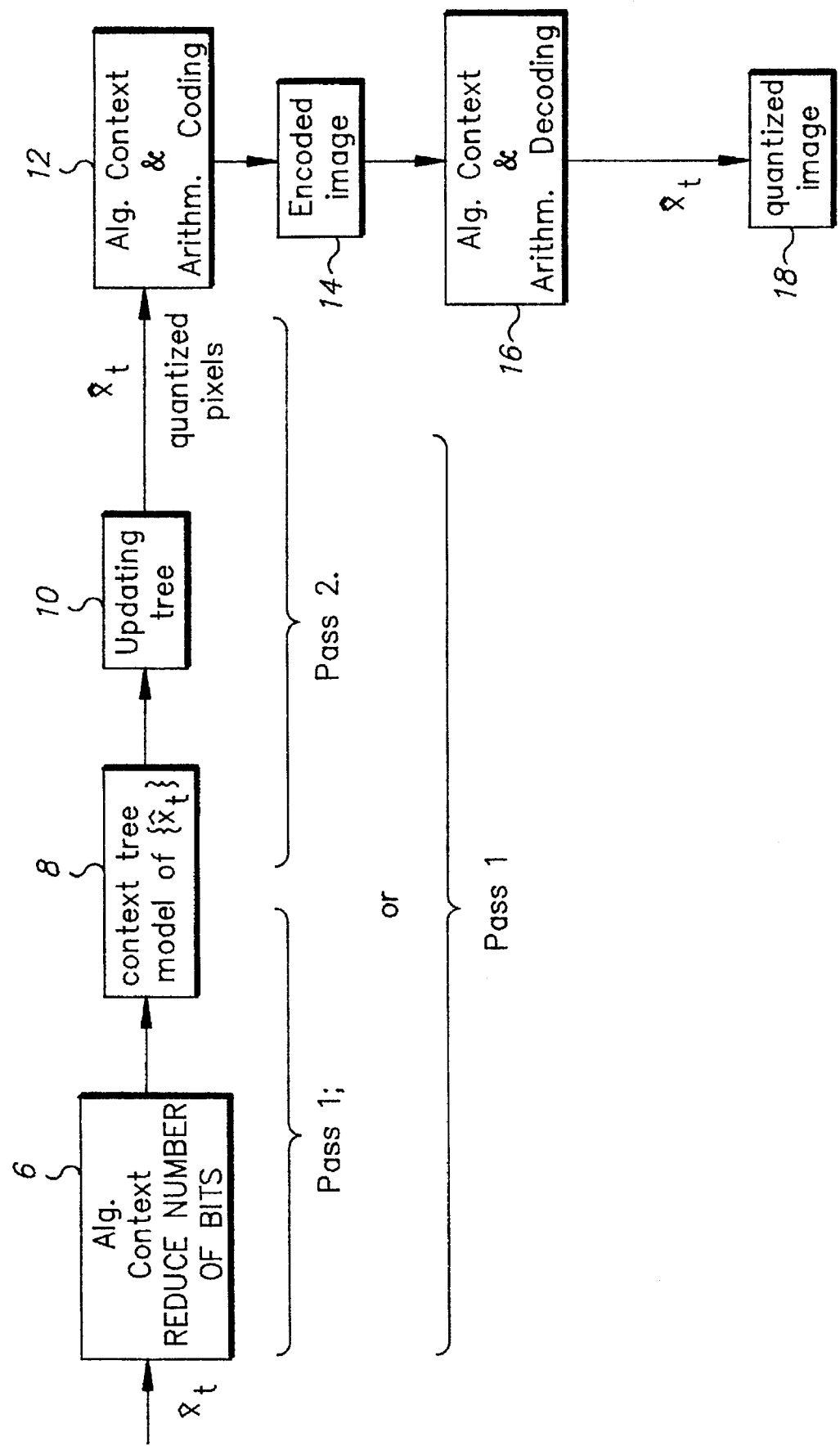
FIG. 3 is a flowchart showing a second embodiment of the method of the invention for pixel data strings having dependencies.

In accordance with one aspect of the present invention, a virtual separation of the two main tasks involved, the quantization itself and the construction of a model accounting for the dependencies of data in the incoming data string or sequence, is achieved. For data strings in which there is no dependency, the quantization task is performed by itself (FIG. 1). For data strings in which there is a dependency, a model is constructed to allow for the dependency, and then the quantization is performed (FIG. 3).

Unlike those quantization techniques depending on Shannon's rate distortion theory, no specific distortion measure is initially selected according to the invention. Rather, the mutual information (or, actually, the code length difference) between the original signal and the quantized signal is itself utilized as the distortion measure.

The amount of distortion and the fidelity of the quantized signal set (e.g., the image quality) is determined by one pre-selected parameter, the number of quantization levels m. Once m is chosen, the the method according to the invention determines the quantized pixels such that the mutual information between the quantized signal and the original signal is maximized.

Thus, the optimal quantization is performed pointwise, i.e., with respect to each individual pixel, without forming vectors of signals. Since large mutual information signifies that the two signals differ little from each other, the optimally quantized signal is contextually as similar to the original signal as is permitted by the pre-selected number of quantization levels. In addition, since a signal truncated to a smaller m value has less information than the same signal truncated to a large m value, the former can be encoded with a shorter code length. Thus, there exists a direct dependency between the fidelity of the quantized signal and its code length.

To understand the essential feature of the above process of optimal quantization, consider first the special case, shown in FIG. 1, in which the signal-generating process, represented as $\{X^n\}$, is independent. That is, there are none of the dependencies (such as those discussed in the Background) between a given image pixel and any other pixels in the image data. For additional background information regarding this special case, see also the so-called Maximum Entropy quantizer taught in Messerschmitt, D. G., "Quantizing for Maximum Entropy," IEEE Trans. Inf. Theory, Vol. IT-17, No. 5 (1971), p. 612.

First, the input data string is quantized to produce a quantized signal X.

Figure 2:
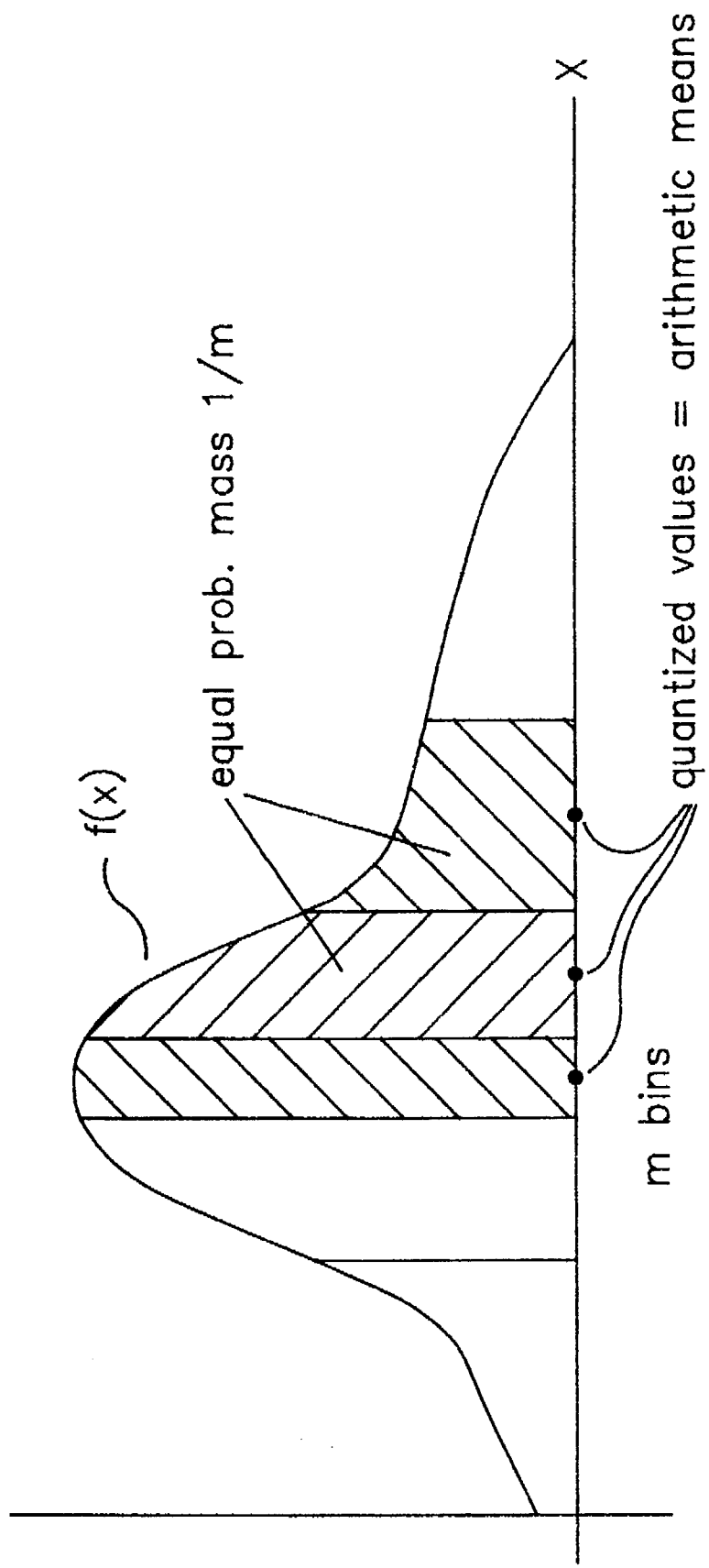
FIG. 2 is a graph which illustrates step 2 of the flowchart of FIG. 1.

Because the quantized signal X is a function of the original signal X, the A mutual information between the two is given by the entropy $H(\hat{X})$ of the quantized signal $\hat{X}$. Notice that the capitalized symbols represent random variables. Given m pre-selected quantization levels, $H(\hat{X})$ is maximized if the quantizer simply spills the range of the independent signal values into m categories, or "bins." This is performed in step 2 of FIG. 1, and illustrated graphically in FIG. 2. The graph of FIG. 2 represents the envelope of an occurrence distribution of symbols within the data string to be quantized and compressed. Vertical lines represent boundaries between categories. In accordance with the invention, the pixels are allocated into m number of bins by value. Thus, the area under the envelope between two adjacent vertical lines represents the total probability mass, or total number of occurrences of all of the symbols which fall within that category. Each category, or "bin," is delimited by the two adjacent vertical lines, so those lines represent maximum and minimum values For the pixels which fall within that bin.

In accordance with the invention, there is an equal probability mass (that is, an equal total number of pixels) within each bin. Thus, bins covering pixel values near the peak of the probability curve (pixel values that occur more frequently) are narrower than those bins for less frequently occurring pixel values, and the areas representing each bin are equal. While the abscissa of the graph of FIG. 2 does not have quantitative values for the positions of the bin-boundary lines to quantify the description given above, it is intended that the graph of FIG. 2 be perceived and understood as per the above discussion.

Returning to FIG. 1, the method of the invention continues in step 4. One of the signal values from each bin is selected as the quantized signal which will represent all of the signals in the ith bin C(i) (step 4). For each bin, the selected value should be related to the values falling within the bin, such that a maximized mutual information log m is achieved. Preferably, the value selected should be one of those values falling within the bin. Alternatively, a mean value can be used.

A distinguished value (that is, a particular given value selected for quantization of the values in the bin) may be obtained by introducing a distance measure so that the mean distance between the original signal and the quantized signal is minimized. This is designated as an equiprobable quantization. For example, if the quadratic measure is chosen, the optimal quantization will result from taking the mean value of each bin as its quantized signal.

Use of a Modeling Algorithm, Such as Context, for Data Sequences Having Dependencies Consider next the general case in which the signal is not independent. This is true for most image data sets, in which regions of contiguous pixels have identical or nearly identical values.

In accordance with the invention, the dependencies of the signal values are taken into account as part of the overall quantization process. A universal modeling algorithm is applied to represent the signal as a Markov process, where symbol occurrences at each state are nearly independent. A preferred modeling algorithm is the algorithm called "Context," which is described in the following three papers:

(1) J. Rissanen, "A Universal Data Compression System," IEEE Trans. Inform. Theory, Vol. IT-29, No. 5, pp. 656–664, September 1983;

(2) J. Rissanen, "Universal Coding, Information, Production and Estimation," IEEE Trans. Inform. Theory, Vol. IT-30, No. 4, pp. 629–636, August 1983; and (3) J. Rissanen, "Complexity of Strings in the Class of Markov Sources," IEEE Trans. Inform. Theory, Vol. IT-32, No. 4, pp. 526–532, July 1986. These papers, in their respective entireties, are herein incorporated by reference to provide a background for the Context method. Essentially, the Context algorithm operates on a data string to build a tree, each data value in the data string being assigned to a node of the tree. The term "context" refers to the data values assigned to a given one of the nodes. The tree is a model of the data string. The data values assigned to each given node are quantized separately.

After the modeling has been done, the data is quantized in the manner described above, using the equiprobable quantizer. The number of quantized levels at each state is suitably selected.

However, to execute this method, two considerations are involved. First, a decoder must be able to grow a tree identical to that produced by the encoder. To achieve this, the states, or contexts constructed by the algorithm are expressed in terms of past quantized values. An image made of pixel data values is treated as a data string, i.e., as a sequence of data values for the various pixel positions of the image. Preferably, the image is treated as a raster scanned image. Thus, a raster scan line is treated as n series of contiguous data values within the image data string, each pixel successively to the right of the previous pixel corresponding with a successive value in the string. Also, given a scan line with w, a data value w positions behind a given data value in the string, the given data value corresponding with a given pixel of the image, corresponds with a pixel above the given pixel. Thus, for the purpose of this invention, a context of a data value in the data string actually corresponds with the context of the given pixel in the image, i.e., the pixels located near the given pixel.

The second consideration is as follows: As the distribution in each context is constructed, the number of quantized levels, or bins, is allocated to the contexts based on a quantity related to the distribution. Preferably, the number of bins is determined by the entropy of the distribution described at that node. The number of bins determines the number of bits needed to describe a quantized data value at that node.

The Context algorithm, as described in the papers cited above, requires the original, full-precision symbols. These symbols, however, are not available to the decoder. Therefore, in accordance with the invention, a modified version of the Context algorithm is used. The modified Context method includes two parts, a tree-growing scheme and a context-selection scheme. The modified Context algorithm constructs a tree in accordance with rules which the decoder can duplicate. Therefore, the decoder can produce an identical tree, and decode the compressed data correctly.

The modified version employs two distinct passes through the data, and is illustrated in the flowchart of FIG. 3. The first pass includes quantizing the image data string to a reduced number of bits, such as from eight bits down to six bits (step 6). As a consequence, the context tree which is subsequently produced (step 8) is smaller, but has larger symbol occurrence counts at the nodes. Because of these characteristics of the context tree, the model is improved, and distortion is generally negligible. Each given pixel $\hat{x}_{t+1}$ has a context made up of other pixels based on geometric proximity to the given pixel in a raster scan array. The context of the quantized pixel $\hat{x}_{t+1}$ is a prefix of the past string $\hat{x}_t, \hat{x}_{t+1-w}, \hat{x}_{t-w}$. These pixels are to the left of, or above, the given pixel, where w is the raster scan width, and the pixels progress horizontally across a raster scan line from left to right.

The first pass, which started with the input pixel data string, produces as its output a tree (step 8), in which each leaf designates an optimal encoding node or context. This context is designated $\hat{S}^*$. Each node in the tree has a count of each (quantized) pixel occurrence at that node. The quantized pixels (for instance, the pixels initially quantized from eight bits to six bits) are an initial quantization.

In the second pass, this initial quantization is updated (step 10). The optimal contexts themselves are also updated, except for their depth on the tree, along with their symbol occurrence counts. The count of the occurrences of a symbol j in the past string $\hat{x}_1, \hat{x}_2, \ldots, \hat{x}_t$ of pixels which precede the current pixel $\hat{x}_{t+1}$ whose context is $\hat{s}$ is designated as $c_t(j/\hat{s})$. The sum $c_t(\hat{s})$ of all occurrences of all symbols in the above past string is given as $$c_t(\hat{s}) = \sum_j c_t(j/\hat{s}).$$

While, conventionally, symbol occurrence counts have been integers, they are so updated, according to the invention, that they need not be integers.

Consider a d-symbol alphabet A and a d-ary tree T, constructed recursively for a data sequence $x^t = x_1, \ldots, x_t$, $t=0, 1, 2, \ldots$, while $x^0 = \lambda$ denotes the null string (an empty context). The tree is defined according to a context selection rule $x^t = x_{t1}, x_{t2}, \ldots$, the right-hand side being a reordering of the symbols in $x^t$ according to their expected importance in influencing the next symbol, $x_{t+1}$. For instance, in Markovian models, the context selection rule is $x_{t1} = x_t$, $x_{t2} = x_{t-1}$, etc.

As regards image signals, $x_{t1}$ may be taken as the pixel value $x_t$ immediately to the left of $x_{t+1}$. Similarly, $x_{t2}$ could be the pixel value $x_{t+1-w}$ located directly above $x_{t+1}$ in the image, where w is the number of pixels in a scanned row.

For simplicity in the notations, the Markovian rule is used in the following description. Notice also that the contexts in the final context tree will be constructed out of the quantized signals, not the original signals.

The growth of the tree from $T_0$ to $T_{t+1}$ takes the following steps:

1. Initialize the d symbol-occurrence counters of the single node of the tree $T_0$ to 0. This node contains the empty context $\lambda$.
2. Recursively, having constructed the tree $T_t$ from $x^t$, climb the tree along the path $x_t, x_{t-1}, \ldots$, into the past. For each node s visited, update the appropriate one of its d symbol-occurrence counters $\{c_t(i|s)\}$, i ∈A, by 1, i.e., $$c_{t+1}(x_{t+1}|s) = c_t(x_{t+1}|s) + 1.$$

3. If the value of the last updated counter $c_{t+1}(x_{t+1}|s)$ for a node, for example $x_t, x_{t-1}, \ldots, x_{t-k}$, becomes at least 2, extend the tree by a new node $x_t, x_{t-1}, \ldots, x_{t-k}, x_{t-k-1}$. The d symbol-occurrence counters of the new node are initialized by setting $c_{t+1}(x_{t+1}|s)$ to 1 and $c_{t+1}(i|s)$ to 0 for $i \neq x_{t+1}$. The depth k can be any integer up to a preselected bound, e.g., 5. The larger the value of k, the deeper the node is in the tree. Each node along the given path corresponds to a context for $x_{t+1}$. This completes the growth of the tree $T_{t+1}$.

The next part of the method according to the invention is the selection of a distinguished context among the substrings $x_t, x_{t-1}, \ldots$ for each symbol $x_{t+1}$ in the data sequence. This is done in step 12. Afterward, quantization is performed in accordance with the basic quantization process of FIG. 1, on a per context basis, treating the pixels within each context (i.e., each tree node), as though there were no independencies. An encoded image is then produced (step 14). The quantized image (18) may then be recovered by decoding in step 16.

Context selection is done according to a predictive, or equivalently, stochastic complexity argument. That is, the context which would have allowed the shortest code length for its symbol occurrences in the past string is selected. This requires that the code lengths be calculated in a predictive manner. No conditional entropy argument will satisfy this requirement, because the deeper the node is (i.e., k gets larger), the smaller the conditional entropy becomes, and an additional ad hoc stopping rule is required. Thus, the predictive code length L(i|s) for the occurrence of the symbol i representing $x_{t+1}$ in a context s defined by $x_t, x_{t-1}, \ldots$ may suitably be taken as $L(i|s)=-\log P(i|s)$, where $$P(i|s) = \frac{c_t(i|s) + 1/2}{c_t(s) + d/2},$$

and $$c_t(s) = \sum_j c_t(j|s).$$

Notice that P(i|s) is a function of the past counter values collected from $x^t$ and stored in the node s of the tree $T_t$. One skilled in the art will recognize that predictive rules other than the above expression may also be used.

It is generally a rather elaborate process to select an optimal context for $x_{t+1}$ by comparing the nodes along the path starting at the root. Moreover, for many sources the efficiency of a node in such a comparison process tends to increase monotonically only up to a point, after which the efficiency tends to decrease. Thus, a simple comparison of each successive pairs of nodes may suffice. This can conveniently be done by slotlag at each node an updated index representing the efficiency difference between the node and its preceding node along the given path, i.e., the father node. Specifically, let $x_t, x_{t-1}, \ldots, x_{t-k}$ define a node s in the tree $T_t$, other than the empty root node, and let $s'=x_t, x_{t-1}, \ldots, x_{t-k+1}$ be its father node. Let $E(s,t)=L(x_{t+1}|s)-L(x_{t+1}|s')$ denote the difference in code lengths. If the difference is negative, the node is more efficient than its father node for the symbol occurrence relating to $x_{t+1}$. The difference is recursively accumulated far all the past symbol occurrences in s'; the result $E_c(s, t)$ is an efficiency index and stored in an efficiency register of the node s in the tree $T_t$. By definition, the node s is a better node than its father node if $E_c(s, t)<0$ at time t. The efficiency index of the root node, $E_c(\lambda, t)$, is kept at a fixed negative value. The optimal encoding node/context $s^*(x^1)$ is taken as the last node with a negative efficiency index. Notice that, in light of the predictive way code lengths are calculated, the index $E_c(s, t)$ is not automatically negative even though the node s has its own symbol-occurrence counts, and its father node s' may have the counts of many other symbol occurrences as well.

Alternatively, the efficiency index may be determined recursively by $$E_c(s,t)=\min\{b_1, E_c(s, t-1)+E(s,t)\} \text{ if } E(s,r) \geq 0;$$

$$E_c(s,t)=\max\{b_0, E_c(s, t-1)+E(s,t)\} \text{ if } E(s,t)<0.$$

The positive upper bound $b_1$ and the negative lower bound $b_0$ are imposed to stop taking account of the remote past.

Having grown the tree and selected the optimal context, the modified Context method gives the final code length (or information content) $I(x^n)$ for the data sequence $x^n$, $n=1,2,\ldots,t$, as $$I(x^n) = -\sum_{t=0}^{n-1} \log P(x_{t+1}|s^*(x^t)). \tag{1}$$

A probability distribution is assigned to every data sequence $x^n$. A preferred probability distribution is $P(x^n)=2^{-I(x^n)}$. This probability distribution satisfies the conditions for an information source, and is familiar to persons skilled in the art of data compression and coding. Further, the above optimal node-selection and encoding process, or other equivalent processes or combinations of schemes which may becomes obvious to one skilled in the art after the above teachings, is universal among the Markov sources, in the sense that such a process simulates the behavior of any Markov process defined by any of its long typical strings. Still further, the above process is asymptotically optimal in a definite sense.

Dependent Process

Having laid a foundation for the design of a practical quantizer, consider next a dependent process defined by the family of conditional distributions defined by the density functions $f(x_{t+1}|x^t)$. Such a process is of great practical importance, since most image data are generated by such n dependent process defined by conditional distributions. In this regard, methods toward maximizing the mutual information in Eq.(2) can be chosen in a number of ways. Two particular embodiments are hereinafter described to teach how to make effective use of the aforementioned modified Context method to maximize the mutual information in Eq.(2).

First Embodiment: a Single Pass of the Context Algorithm

In accordance with one particular embodiment, the aforementioned modified Context method (or its physical embodiment equivalent) first processes the above data sequence $x^n$ to generate the optimal states or contexts as well as the conditional distributions of the symbol occurrences in these contexts. As a result, the symbol occurrences in each context can be quantized as if they were independent. Thus the aforementioned equiprobable bins and their mean values can be used to quantize the data sequence. Subsequently, the Context method, together with an arithmetic coder known to one skilled in the art, processes the quantized data to generate the encoded string.

For an example or arithmetic coding, see K. Mohiuddin and J. Rissanen, "Multiplication-free Multi-alphabet Arithmetic Code," U.S. Pat. No. 4,652,856, issued Mar. 24, 1987, which is incorporated by reference in its entirety herein.

Before this particular embodiment is described for realistic image quantization, the idealized situation in which the signal-generating process is a known Markov process is first discussed.

Idealized Situation: Signal Generating Process is Known

Consider the process $f(x^n)$ defined by a finite state machine satisfying the condition $$f(X_{t+1}|X^t)=f(X_{t+1}|s(X^t)),$$

where the context map $s(X^t)$ has a finite range S consisting of K elements. Define the conditional mutual information for any process as $$I(X_{t+1}; \hat{X}_{t+1}|X^t)=H(X_{t+1}|X^t)-H(X_{t+1}|(\hat{X}_{t+1}, X^t)), \tag{3}$$

one for each t. Then select $m_s$ ($\geq 1$) distinct quantization levels in state s within the constraint $$\sum_{s \in S} m_s \leq m. \tag{4}$$

Clearly, this requires $m \geq K$ for the constraint to hold. The family of quantizers, $\bar{X}=q(X|s)$, one for each $s \in S$ having $m_s$ distinct elements, is then sought to maximize the set of conditional mutual informations $$I(X, \bar{X}|s) = H(\bar{X}|s) = H(X|s) - H(X|\bar{X}, s), s \in S, \qquad (5)$$

subject to Eq.(4). The maxima log $m_s$ are obtained by the equiprobable quantizers. Further, the allocation of the levels $m_s$ maximizing the mean $$\sum_{s \in S} P(s) \log m_s$$

must be determined. By Shannon's inequality $$\sum_{s \in S} P(s) \log m_s \leq \log m - H(\{P(s)\}), \qquad (6)$$

the equality holding if and only if $m_s|m=P(s)$ for all s. The term $H(\{P(s)\})$ is the entropy defined by the stationary state probabilities. Since the symbol occurrences in each state are independent, the maximized mutual information $I(X^n; \bar{X}^n)$ for sequences $X^n$ and $\bar{X}^n$ is given by $$I(X^n; \bar{X}^n) = n \log m - n H(\{P(s)\}).$$

Notice that this result is reduced to n log m for independent processes, in which P(s)=1, because S consists of only one context. Notice also that, relative to independent processes, the maximized mutual information for dependent processes is reduced by the entropy of the state distribution, $H(\{P(s)\})$.

Realistic Situation: Signal Generating Process is Not Known

In the realistic situation the Markov process $f(x^n)$ is of course not known and will be substituted by the process $P(x^n) = 2^{-I(x^n)}$ by the aforementioned Context method. Then, having obtained the final set of optimal contexts and the resulting code length $I(x^n)$ from Eq.(1), one may build the quantizer by taking the number or levels m, in the optimal node/context s, with the sum m as a parameter, such that $m_s/m$ is close to $c_n(s)/n$, where $c_n(s)$ is the cumulative Counts collected from $x^n$, and is given by the expression $c_n(s) = \Sigma c_n(j|s)$. In each s the bin boundaries are determined such that each bin includes as nearly the same number of symbol occurrences in this context s as possible. The arithmetic mean of each bin is chosen as the representative, or quantized value, of the original symbols falling in that bin in the contexts. Finally, the Context method, together with the prior-art arithmetic coder, is applied to the sequence of the so-quantized values $\hat{x}^n$ to encode each occurrence $\hat{x}_{t+1}$ in its optimal context $\hat{s}^* = \hat{x}_t$, . . . The aforementioned type of predictive probability may be used in this encoding process.

It is noted that the above encoding process using the Context method does not necessarily give a sufficiently short code length. The reason for this is that although the contexts, obtained by applying the modified Context method once, may well be efficient, the same is not necessarily true about the contexts constructed out of the quantized sequence during the second application of the Context method. This difficulty may be circumvented by "matching" the two sets of contexts through an iterative process: Determine a new equiprobable quantizer from the original symbol occurrences in the context s found in the second application of the Context method, followed by another application of the Context method to the so-generated new quantized sequence to create yet another set of contexts s*, and so on. The iteration ends when a fixed sequence of contexts and quantizers emerge. The main difficulty with such an iterative scheme is that it requires a large number of passes through the image. In the next embodiment, the number of iterations can be greatly reduced, depending on the desired version of the quantization scheme.

Second Embodiment: Multiple Passes of the Context Algorithm

In the embodiment discussed above, the Context algorithm is executed initially, prior to quantization, and a second time afterward to encode the quantized values in theor optimal contexts. In accordance with a second particular embodiment of the present invention, the Context algorithm is applied more than once subsequent to quantization.

The modified Context method is applied in the first pass to the strings of the pixels $\hat{x}_t, \hat{x}_{t+1-w}, \hat{x}_{1-w}, \ldots$, quantized uniformly from eight bits to six bits. This reduction in pixel levels, particularly desirable for small images such as a 256 by 256 image and for medium or low bit rate quantization, has the effect of reducing the number of nodes in the tree and in turn keeping larger symbol occurrence counts. In each node of the tree, the counts of the original symbol occurrences are gathered. The optimal encoding nodes s found by the aforementioned predictive criterion (i.e., the stochastic complexity argument) determine a structure of the model to be built in the second pass. Thus, the six-bit signal values are regarded as an initial quantization to be updated in the second pass along with the optimal contexts, except that the depth of the contexts will not be updated. Because of this, the initial tree need not be calculated individually for each image to be processed. In the second pass, the probabilities of the original symbol occurrences in each of the optimal nodes is updated as the ratios $c_t(j|\hat{s})/c_t(\hat{s})$, as explained below in detail. In this expression, $c_t(j|\hat{s})$ denotes a number, not necessarily an integer, representing the frequency of the occurrences of the symbol j in the context $\hat{s}$ in the string $x^t$, and $$c_t(\hat{s}) = \sum_{j \in A} c_t(j|\hat{s}).$$

The second pass starts with the smallest complete tree $S_k$ of the maximum depth k, defined by the optimal nodes $\hat{s}^*$ obtained in the first pass. Leave the first k quantized numbers $\hat{x}_1, \ldots \hat{x}_k$ as the six-bit truncations. For t=k initialize the numbers $c_t(j|\hat{s}^*)$ as the actual integer-valued symbol counts in the node $\hat{s}^*$. The number of quantization levels, or the number of bins, allocated to the node $\hat{s}^*$ is given by the greatest integer lower bound $$m_t(\hat{s}^*) = \lfloor (K c_t(\hat{s}^*)/n),$$

where the parameter K is so large that the number of quantization levels remains at least one throughout the subsequent processing. Clearly, K will be close to the total number of levels permitted, with which the desired quality of the image can be controlled. Next, given the number of quantization levels $m_t(\hat{s}^*)$, the bins $C_t(i|\hat{s}^*)$ in each optimal node at time t are so determined that each bin includes exactly the same (if possible) or approximately the same probability mass as defined by the count ratios $c_t(j|\hat{s}^*)/c_t(\hat{s}^*)$. The arithmetic mean μin each bin is computed as $$\mu_i(i|\hat{s}^*) = \sum_{j \in C_i(i|\hat{s}^*)} \frac{c_t(j|\hat{s}^*)}{N_t(i|\hat{s}^*)} j,$$

where $$N_t(i|\hat{s}^*) = \sum_{j \in C_t(i|\hat{s}^*)} c_t(j|\hat{s}^*).$$

The truncation of $N_t(i|\hat{s}^*)$ to six bits is chosen as the representative or the common quantized value of the symbols falling in the ith bin.

The tree $S_t$, intially $S_k$, with its optimal encoding nodes $s^t(\hat{x}^t)$ having been constructed, attention is now turned to the steps needed to calculate the tree $S_{t+1}$:

1. Read the next symbol $x_{t+1}$ climb the tree along the path given by the past quantized symbols in the above-described order, namely, $\hat{x}_t, \hat{x}_{t+1-w}, \hat{x}_{t-w}, \ldots$, until an optimal node $\hat{s}^*$ is reached.
2. Update the counter value $c_t(x_{t+1}|\hat{s}^*)$ by the scheme $$c_{t+1}(x_{t+1}|\hat{s}^*) = c_t(x_{t+1}|\hat{s}^*) + (x_{t+1} - \hat{x}_{t+1})^\alpha,$$

where $\hat{x}_{t+1}$ is the arithmetic mean of the bin in which $x_{t+1}$ falls and $\alpha$ is a nonnegative parameter; the value zero gives the usual counting updates, whereas the value 2 was found to give the best image quality, if not the best signal-to-noise ratio.

3. If the updating in 2. changes the distribution, re-determine the number of quantization levels at this node, the equiprobable bin boundaries, and the new means for the bins; this completes the growth of the tree $S_{t+1}$.

Notice that in the last step above, to keep the bins exactly or approximately equiprobable, the boundaries of the bin enclosing $x_{t+1}$ tend to move closer to each other, resulting in the desirable consequence that the bin representative also tends to creep closer to $x_{t+1}$. As a result, the quantization error for the next occurrence of the same symbol is reduced.

In the final pass, the Context algorithm is applied to the quantized image, and each quantized pixel is then encoded with arithmetic coding to generate the encoded quantized image.

Other Aspects

In both of the above particular embodiments of the present invention, the Context quantizer compresses images better than a typical vector quantizer (VQ), e.g., the above-identified LBG method. To surpass the performance of the JPEG method, pre-filters such as those used in the aforementioned subband coding method may be used to split the original image into subimages, each of which is then handled by the Context quantizer. The results are finally interpolated to the original resolution and added to form the final quantized product.

Furthermore, in slowly changing regions of an image, the distributions of signals sampled by the Context quantizer at the relevant contexts will be sharply peaked, casting little uncertainty as to the representative pixel value for each context. Instead of encoding the quantized values, the approximate values calculated relative to the modeled Markov machine may be encoded with a shorter code length. This process is iterated until a suitable measure of the skewness of each distribution, e.g., the entropy, exceeds a threshold value to be optimized by the encoder. Determined by the modeled machine, this nonlinear extrapolation process generates extrapolated pixel values effectively, particularly when the dominant low-pass filter of the subband method tends to smoothen the image. The extrapolation also allows an image to be encoded at variable resolutions, which is not attainable in other quantization methods.

Other Aspects of the Three Pass Version

The aforementioned three-pass version of the universal Context quantizer allows several variations. For instance, the optimal tree obtained with the very first application of the Context method may be determined as an average of a number of pre-selected images, stored in a suitable storage medium, and used as an initial tree (i.e., $S_k$) to be updated by the second application of the Context method, as described above. The average image is formed using standard published images known and routinely used in the field of image processing.

In yet another variation, the aforesaid updating process can be skipped, resulting in a very fast quantization scheme. If such a scheme is used, there is, of course, some deterioration in the image quality for each chosen codelength. Nevertheless, the image quality may still be more than acceptable. On the other hand, given the same image quality, the loss of compression in using such a fast quantization scheme, as compared to using a universal Context quantizer, is typically 10 to 15%, which is also acceptable for a variety of applications.

SUMMARY, CONCLUSION

By reading the above teachings of the present invention, those skilled in the art will recognize that the foregoing novel Context quantizer may be used to process real-valued signals not only in the two-dimensional plane but also in the time domain. This feature is conceivably suitable for compressing continuous image or video signals, including a motion picture. For example, the aforesaid fast Context quantization scheme may be used to encode, with acceptable efficiency and fidelity, the bulk of a typical motion-picture frame which does not change appreciably from either the previous or the following frame.

Those skilled in the art will further recognize that the foregoing novel context quantizer is applicable to the processing of real-valued signals regardless of the format in which the signals are expressed. For example, the context quantizer is equally applicable whether the pixels of a color image are expressed in RGB (red-green-blue) or YIQ (luminance-chrominance) components. Furthermore, while the preferred use of the present invention is the compression/quantization of image or video signals, the present invention is broadly applicable to the processing of any signal-carrying video or audio data intended for viewing or hearing by human beings.

Those skilled in the art will further recognize that the foregoing novel context quantizer may also be implemented by appropriate hardware or firmware, including digital circuits and elements, random-access memories, read-only memories, etc. They will also realize that the present invention may suitably be implemented on parallel processing architecture, which conceivably will permit real-time or near-real-time compression, transmission and decompression of continuous black-only or color video signal frames.

While the preferred embodiments of the present invention have been illustrated in detail, it should be apparent that modifications and adaptations to those embodiments may occur to one skilled in the art without departing from the scope of the present invention as set forth in the following claims.

What is claimed is:

1. A method for performing data compression on data elements of a body of input data, each data element having a respective context, the method comprising the steps of:

quantizing each of the data elements separately, based on the context of that data element, thereby performing a lossy data compression of the data elements;

dividing the quantized data elements, by value, into a predetermined number of categories;

for each of the categories, selecting a respective value as a single quantized value to represent each of the data elements of the category;

determining whether the body of input data to be compressed has a dependency: and, responsive to a determination by the step of determining that the body of input data has a dependency, constructing a model to account for the dependency.

2. A method as recited in claim 1, wherein the step of dividing includes dividing the data elements such that, for each of the categories, a total probability of occurrence of all of the data elements within the category is the same, the total probability for each category being a sum of occurrence probabilities for each of the respective data elements within the category, the occurrence probability for each data clement being related to a number of past occurrences of the data clement.

3. A method as recited in claim 1 wherein the step of selecting includes, for each category, selecting the quantization value from among the data elements within the category.

4. A method as recited in claim 1 wherein the step of selecting includes, for each category, selecting the quantization value as a mean value of the data elements within the category.

5. A data compression method as recited in claim 1, wherein the step of constructing a model includes:

building a data tree made up of nodes which correspond with respective values of the data elements, and selecting a respective context for each of the data elements, the step of selecting including obtaining a probability distribution for the data elements based on prior occurrences of the data elements.

6. A method as recited in claim 5, wherein the step of obtaining a probability distribution includes one of (i) obtaining a probability distribution for the data, and (ii) where the probability distribution is not known, using a predetermined probability distribution.

7. A system for performing data compression on data elements of a body of input data, each data element having a respective context, the system comprising:

means for quantizing each of the data elements separately, based on the context of that data element, thereby performing a lossy data compression of the data elements;

means for dividing the quantized data elements, by value, into a predetermined number of categories;

means, operable for each of the categories, for selecting a respective value as a single quantized value to represent each of the data elements of the category;

means for determining whether the body of input data to be compressed has a dependency: and means operable responsive to a determination by the step of determining that the body of input date has a dependency, for constructing a model to account for the dependency.

8. A system as recited in claim 7, wherein the means for dividing includes means for dividing the data elements within the category is the same, the total probability for each category being a sum of occurrence probabilities for each of the respective data elements within the category, the occurrence probability for each data element being related to a number of past occurrences of the data element.

9. A system as recited in claim 7 wherein the means for selecting includes means, operable for each category, for selecting the quantization value from among the data elements within the category.

10. A system as recited in claim 7 wherein the means for selecting includes means, operable for each category, for selecting the quantization value as a mean value of the data elements within the category.

11. A system as recited in claim 7, wherein the means for constructing a model includes:

means for building a data tree made up of nodes which correspond with respective values of the data elements, and means for selecting a respective context for each of the data elements, the means for selecting including means for obtaining a probability distribution for the data elements based on prior occurrences of the data elements.

12. A system as recited in claim 11, wherein the means for obtaining a probability distribution includes means, operable for one of (i) obtaining a probability distribution for the data, and (ii) where the probability distribution is not known, using a predetermined probability distribution.

13. A computer program product, for use with a data processing system, for performing data compression on data elements of a body of input data, each data element having a respective context, the computer program product comprising:

a computer-usable medium;

means, provided on the computer-usable medium, for directing the data processing system to quantize each of the data elements separately, based on the context of that data element, thereby performing a lossy data compression of the data elements;

means, provided on the computer-usable medium, for directing the data processing system to divide the quantized data elements, by value, into a predetermined number of categories;

means, provided on the computer-usable medium, operable for each of the categories, for directing the data processing system to select a respective value as a single quantized value to represent each of the data elements of the category;

means, provided on the computer-usable medium for directing the data processing system to determine whether the body of input data to be compressed has a dependency: and, means operable responsive to a determination by the step of determining that the body of input date has a dependency, provided on the computer-usable medium for directing the data processing system to construct a model to account for the dependency.

14. A computer program product as recited in claim 13, wherein the means for directing to divide includes means, provided on the computer-usable medium, for directing the data processing system to divide the data elements such that, for each of the categories, a total probability of occurrence of all of the data elements within the category is the same, the total probability for each category being a sum of occurrence probabilities for each of the respective data elements within the category, the occurrence probability for each data element being related to a number of past occurrences of the data element.

15. A computer program product as recited in claim 13 wherein the means for directing to select includes means, operable for each category, provided on the computer-usable medium, for directing the data processing system to select the quantization value from among the data elements within the category.

16. A computer program product as recited in claim 13 wherein the means for directing to select includes means, operable for each category, provided on the computer-usable medium, for directing the data processing system to select the quantization value as a mean value of the data elements within the category.

17. A computer program product as recited in claim 13, wherein the means for directing to construct a model includes:

means provided on the computer-usable medium, for directing the data processing system to build a data tree made up of nodes which correspond with respective values of the data elements, and selecting a respective context for each of the data elements; and the means for directing to select including means, provided on the computer-usable medium, for directing the data processing system to obtain a probability distribution for the data elements based on prior occurrences of the data elements.

18. A computer program product as recited in claim 17, wherein the means for directing to obtain a probability distribution includes means, provided on the computer-usable medium, for directing the data processing system to one of (i) obtain a probability distribution for the data, and (ii) where the probability distribution is not known, use a predetermined probability distribution.

* * * * *